March 25, 1969 G. L. PAMLENYI 3,435,362
WIDEBAND DIFFERENTIAL AMPLIFIER HAVING IMPROVED GAIN CONTROL
Filed Dec. 29, 1967
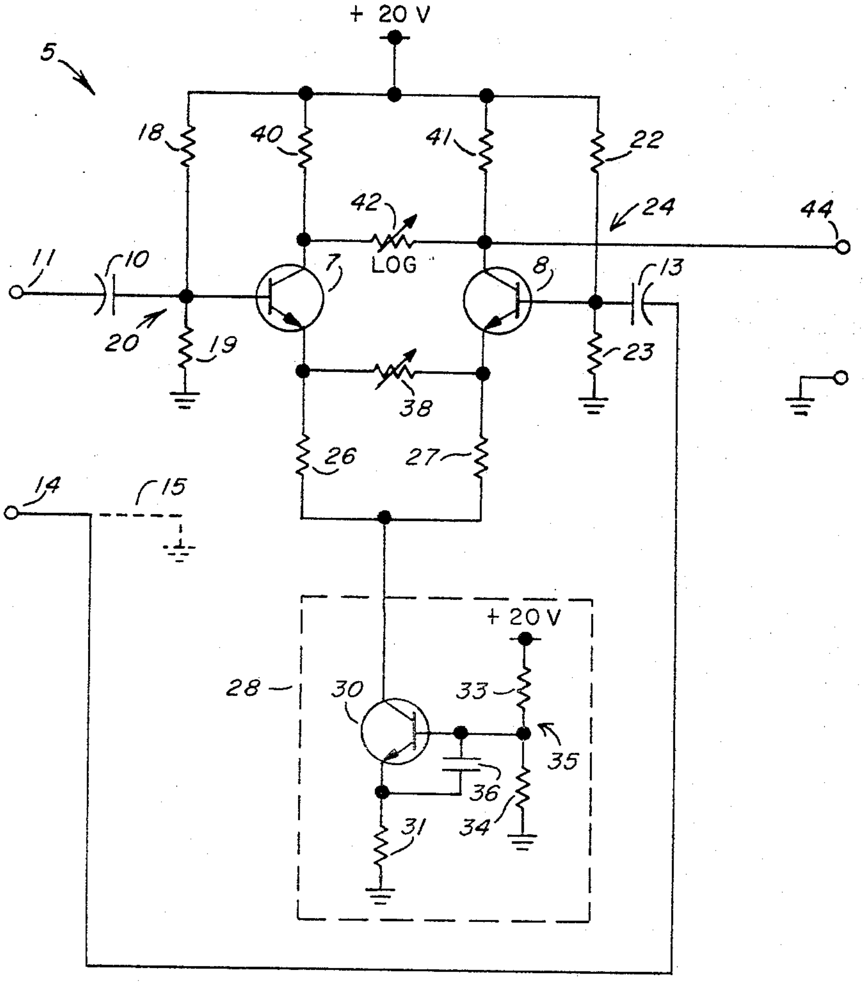
INVENTOR.
GEORGE L. PAMLENYI
BY
Campbell, Harris & O'Rourke
ATTORNEYS United States Patent Office 3,435,362

Patented Mar. 25, 1969

3,435,362

WIDEBAND DIFFERENTIAL AMPLIFIER HAVING IMPROVED GAIN CONTROL

George L. Pamlenyi, St. Paul, Minn., assignor to Ball Brothers Research Corporation, Boulder, Colo., a corporation of Colorado Filed Dec. 29, 1967, Ser. No. 694,535
Int. Cl. H03g *3/30*
U.S. Cl. 330—29 7 Claims

ABSTRACT OF THE DISCLOSURE

A wideband differential amplifier having gain control provided by a potentiometer connected between the emitters and a potentiometer connected between the collectors of the transistors of the amplifier with the resistance of the potentiometer connected between the collectors varying as a logarithmic function and the potentiometer connected between the emitters being connected to a constant current generator.

BACKGROUND OF THE INVENTION

*Field of the invention*

This invention relates to differential amplifiers and more particularly relates to wideband differential amplifiers having an improved gain control circuit.

*Discussion of the prior art*

Differential amplifiers are well known in the field of electronics and have been utilized in a variety of different applications.

One of the more useful applications of the differential amplifier has been in the area of communications to commence and terminate balanced two-wire transmission lines, since such an amplifier is capable of removing spurious currents induced on the line during transmission. The use of a differential amplifier in this manner has been shown, for example, in U.S. Patent 3,268,829, issued Aug. 23, 1966.

In use, the differential amplifier is commonly utilized to suppress common mode components, such as, for example, spurious currents such as hum induced on both wires of a two-wire transmission line during transmission of a signal thereover. The differential amplifier is able to suppress this common mode component since it is balanced out in the amplifier, and hence the difference signal, which includes only the transmitted intelligence not common to both transmission lines, appears at the output of the amplifier.

While the use of gain control circuits for differential amplifiers is likewise quite well known, the circuits heretofore known and/or utilized have not proved to be completely satisfactory for every purpose and particularly for use in wideband differential amplifiers. In such devices, gain has heretofore commonly been varied with a low resistance potentiometer so that uniform attenuation is achieved in the high frequency region with blocking capacitors being utilized to block the passage of DC current through the potentiometer all of which results in a requirement for excessive driving power for the low resistance utilized and the presence of the series-connected blocking capacitors results in a limitation of the low frequency response.

SUMMARY OF THE INVENTION

This invention provides a differential amplifier having superior gain control characteristics achieved through the use of dual gain controls, one of which preferably varies as a logarithmic function.

It is therefore an object of this invention to provide a differential amplifier having superior gain control characteristics.

It is another object of this invention to provide an improved differential amplifier having a gain control the resistance of which varies as a logarithmic function.

It is still another object of this invention to provide an improved differential amplifier having a gain control which includes potentiometers connected between each of two like electrodes of amplifying devices with one of said potentiometers being connected to a constant current generator.

It is still another object of this invention to provide an improved gain control circuit for use in a wideband differential amplifier.

With these and other objects in view, which will become apparent to one skilled in the art as the description proceeds, this invention resides in the novel construction, combination, and arrangement of parts substantially as hereinafter described, and more particularly defined by the appended claims, it being understood that such changes in the precise embodiment of the hereindisclosed invention are meant to be included as come within the scope of the claims.

BRIEF DESCRIPTION OF THE DRAWING

The accompanying drawing illustrates a complete embodiment of the invention according to the best mode so far devised for the practical application of the principles thereof, and in which the single figure of the drawing is a schematic presentation of a differential amplifier with the improved gain control of this invention.

DETAIL DESCRIPTION OF THE PREFERRED EMBODIMENT

Referring now to the drawing, the numeral 5 refers generally to the differential amplifier of this invention, which amplifier includes a pair of transistors, or amplifying devices, 7 and 8. The base of transistor 7 is connected through coupling capacitor 10 to input terminal 11 adapted to receive one input signal. In like manner, the base of transistor 8 is connected through coupling capacitor 13 to terminal 14 adapted to receive a second input signal. When the differential amplifier is utilized to terminate a two-wire transmission line, the input terminals 11 and 14 are, of course, connected to the two wires of the line, which could be, for example, the center cable and surrounding sheath of a coaxial cable.

A ground lead 15 is provided at either terminal (indicated at terminal 14 in the drawing for illustrative purposes) so that the terminal can be grounded if this mode of operation is to be utilized.

The base of transistor 7 is connected to the junction of serially connected resistors 18 and 19, which resistors form a voltage divider 20 connected between a +20 volt source (not shown) and ground. In like manner, the base of transistor 8 is connected to the junction of serially connected resistors 22 and 23, which resistors form a voltage divider 24 connected between the +20 volt source (not shown) and ground.

The emitters of transistors 7 and 8 are connected through resistors 26 and 27 to constant current generator 28. Constant current generator 28, which simulates a very large emitter resistance without any reduction of current, includes a transistor 30, the collector of which is connected to the junction of serially connected resistors 26 and 27, the emitter of which is connected to ground through resistor 31, and the base of which is connected to the junction of serially connected resistors 33 and 34, which resistors form a voltage divider 35 connected between the +20 volt (not shown) and ground. In addition, a capacitor 36 is preferably connected between the base and emitter of transistor 30.

A potentiometer 38 is connected between the emitter of transistors 7 and 8, which potentiometer acts as a set-up gain control for the differential amplifier.

The collectors of transistors 7 and 8 are connected to the +20 volt power supply (not shown) through resistors 40 and 41, respectively. A potentiometer 42 is connected between the collectors of transistors 7 and 8, which potentiometer serves as a master gain control for the differential amplifier. Potentiometer 42 preferably has a logarithmic taper so that the resistance varies as a logarithmic function.

The output from the circuit is taken from the collector of transistor 8 and coupled to output terminal 44. While not shown, an output can also be taken from the collector of transistor 7, which output would exhibit the same characteristics as the output from the collector of transistor 8, except that the signal would be 180° out of phase with respect to the output signal appearing at the collector of transistor 8. If desired, the differential amplifier could therefore be utilized for a single-ended input and double-ended output, rather than the double-ended input and single-ended output as shown in the drawings.

Components of a working embodiment of the differential amplifier are as follows:

Transistors 7, 8 and 30—2N3903; capacitors 10 and 13—50$\mu$mf.; capacitor 36—.01$\mu$mf.; resistors 18 and 22—33K; resistors 19 and 23—47K; resistors 26 and 27—1K; resistor 31—150; resistor 33—15K; resistor 34—2.2K; resistors 40 and 41—820; potentiometer 38—0–4K; and potentiometer 42—0–1K (logarithmic taper). The components set forth hereinabove are illustrative only of a working embodiment and accordingly, the invention is not meant to be limited to the particular components or values set forth.

In operation to terminate a two-ended transmission line, for example, each line is connected to a different terminal so that the input signal appears at the bases of the two transistors of the differential amplifier. The output appearing at single-ended output terminal 44 (from the collector of transistor 8) will be the difference between the two signals with the input signals having identical phase and amplitude being rejected. This means, of course, that common mode signals, such as noise induced on the transmission line common to both lines, will be suppressed. Hence, the DC currents through transistors 7 and 8 will always be in balance so that the signal components only are present across variable resistor 42.

It is a feature of this invention that the gain control for the differential amplifier is provided by a pair of potentiometers 38 and 42. Set-up gain control is provided by potentiometer 38, while master gain control is provided by potentiometer 42, which preferably has a logarithmic taper to obtain a linear output voltage over the range of a normally utilized control, such as a rotational control, for example. By utilizing the two potentiometers 38 and 42 in conjunction, the frequency response of the gain control can be extended from DC to high frequencies.

If potentiometer 42 is shorted, no output signal will appear at output terminal 44, while shorting of potentiometer 38 will cause the amplifier to have maximum gain. Thus, positioning of potentiometers at any point other than zero will reduce gain and raise maximum input voltage.

This invention thus provides an improved differential amplifier having set-up and master gain control, with the resistance of the master gain control varying as a logarithmic function, to achieve a heretofore unavailable control that is particularly well suited for use in a wideband differential amplifier.

What is claimed is:

1. A wideband differential amplifier, comprising: first and second amplifying devices each of which has common, control, and output electrodes; first and second input means connected with said control electrodes of said first and second amplifying means, respectively; a first potentiometer connected between said common electrodes of said amplifying devices to provide a set-up gain control; a second potentiometer connected between said output electrodes of said amplifying devices to provide in conjunction with said first potentiometer a master gain control; and output means connected to one of said output electrodes of said amplifying devices, the output signal coupled therefrom being the difference between said input signals.

2. The amplifier of claim 1 wherein the resistance of said second potentiometer varies as a logarithmic function.

3. The amplifier of claim 1 further characterized by a constant current generator connected with said second potentiometer through a pair of parallel connected resistors.

4. A wideband differential amplifier, comprising: first and second amplifying devices each of which has common, control, and output electrodes; first and second input means connected with said control electrodes of said first and second amplifying devices, respectively; a first potentiometer connected between the common electrodes of said amplifying devices; a constant current generator connected with said first potentiometer; a second potentiometer connected between the output electrodes of said amplifying devices, said second potentiometer having a resistance which varies as a logarithmic function; and an output terminal connected to the output electrode of one of said amplifying devices for coupling a difference signal from the amplifier.

5. The amplifier of claim 4 wherein said potentiometers extend the frequency response of said amplifier from DC to high frequencies.

6. A gain control circuit for a wideband differential amplifier having a pair of transistors with control, common, and output electrodes, said gain control circuit comprising: a first potentiometer connected between the common electrodes of said differential amplifier and providing a set-up gain control; and a second potentiometer connected between the output electrodes of said amplifying devices for producing a master gain control, said potentiometers together providing a gain control having a frequency response from DC to high frequencies.

7. The gain control circuit of claim 6 wherein said second potentiometer has a logarithmic taper so that the resistance of the potentiometer varies as a logarithmic function.

References Cited

UNITED STATES PATENTS 3,323,070 5/1967 Hayes.

JOHN KOMINSKI, *Primary Examiner.*

J. B. MULLINS, *Assistant Examiner.*

U.S. Cl. X.R.

330—30 69